United States Patent
Tattershall et al.

(10) Patent No.: US 8,786,372 B2
(45) Date of Patent: Jul. 22, 2014

(54) DUAL PRIMARY SWITCHED TRANSFORMER FOR IMPEDANCE AND POWER SCALING

(71) Applicant: RF Micro Devices, Inc., Greensboro, NC (US)

(72) Inventors: Wayne D. Tattershall, Cedar Rapids, IA (US); David E. Jones, Cedar Rapids, IA (US)

(73) Assignee: RF Micro Devices, Inc., Greensboro, NC (US)

(*) Notice: Subject to any disclaimer, the term of this patent is extended or adjusted under 35 U.S.C. 154(b) by 86 days.

(21) Appl. No.: 13/657,300

(22) Filed: Oct. 22, 2012

(65) Prior Publication Data

US 2013/0099858 A1 Apr. 25, 2013

Related U.S. Application Data

(60) Provisional application No. 61/550,088, filed on Oct. 21, 2011.

(51) Int. Cl.
*H03F 3/04* (2006.01)
(52) U.S. Cl.
USPC .................. 330/301; 330/195; 330/124 R
(58) Field of Classification Search
USPC ................. 330/301, 195, 124 R
See application file for complete search history.

(56) References Cited

U.S. PATENT DOCUMENTS

| 4,409,987 | A * | 10/1983 | McIntyre ............... 600/544 |
| 7,368,880 | B2 * | 5/2008 | Lyle et al. ............... 315/247 |
| 8,134,408 | B2 * | 3/2012 | Kawakami et al. ........... 330/276 |
| 8,373,519 | B2 * | 2/2013 | Sinha et al. .................. 333/101 |
| 8,604,874 | B2 * | 12/2013 | Bendixen ................... 330/124 R |
| 2010/0019857 | A1 * | 1/2010 | McMorrow et al. ............ 333/32 |

OTHER PUBLICATIONS

Park et al., "A 1.8-Ghz CMOS power amplifier using a dual-primary transformer with improved efficiency in the low power region," IEEE Transactions on Microwave Theory and Techniques, vol. 56, No. 4, Apr. 2008, pp. 782-792.
Kim et al., "A linear multi-mode CMOS power amplifier with discrete resizing and concurrent power combining structure," IEEE Journal of Solid-State Circuits, vol. 46, No. 5, May 2011, pp. 1034-1048.
Doherty, "A new high efficiency power amplifier for modulated waves," Proceedings of the Institute of Radio Engineers, vol. 24, No. 9, Sep. 1936, pp. 1163-1182.
Aoki, I. et al., "Distributed active transformer—A new power-combining and impedance-transformation technique," IEEE Transactions on Microwave Theory and Techniques, vol. 50, No. 1, Jan. 2002, pp. 316-331.
Liu, et al., "Fully integrated CMOS power amplifier with efficiency enhancement at power back-off," IEEE Journal of Solid-State Circuits, vol. 43, No. 3, Mar. 2008, pp. 600-609.

* cited by examiner

*Primary Examiner* — Patricia Nguyen
(74) *Attorney, Agent, or Firm* — Withrow & Terranova, P.L.L.C.

(57) ABSTRACT

This application reduces the power of series combined transformers and of parallel combined transformers while maintaining efficiency. In one embodiment, a series combined transformer is provided with a switch between a first primary inductor and a second primary inductor, in order to provide at least two modes. In a high power mode, the switch is open and the series combined transformer operates normally. In a low power mode, the switch is closed, one amplifier from a first differential amplifier pair is shut down, one amplifier from a second differential pair is shut down, and the series combined transformer operates efficiently in a low power mode.

25 Claims, 8 Drawing Sheets

NOVEL SERIES COMBINED TRANSFORMER (SCT)

FIG. 3
SERIES COMBINED TRANSFORMER (SCT)

FIG. 4
NOVEL SERIES COMBINED TRANSFORMER (SCT)

FIG. 5
SERIES COMBINED TRANSFORMER (SCT)

*FIG. 6*
PARALLEL COMBINED TRANSFORMER (SWITCHED OPEN)

*FIG. 7*
PARALLEL COMBINED TRANSFORMER (SWITCHED CLOSED)

FIG. 8

DUAL PRIMARY SWITCHED TRANSFORMER FOR IMPEDANCE AND POWER SCALING

RELATED APPLICATIONS

This application claims the benefit of provisional patent application Ser. No. 61/550,088, filed Oct. 21, 2011, the disclosure of which is hereby incorporated herein by reference in its entirety.

FIELD OF THE DISCLOSURE

This application is directed to the field of power scaling dual transformers. Specifically, this application is directed to reducing the power of series combined transformers and parallel combined transformers while maintaining efficiency.

BACKGROUND

Conventional methods for operating power amplifiers at powers less than their maximum power always cause inefficiency and nonlinearity. Additionally, conventional methods lose accuracy (in both the real and imaginary planes) over the desired bandwidth as the power is reduced below the maximum power of the power amplifier.

Figure 1:
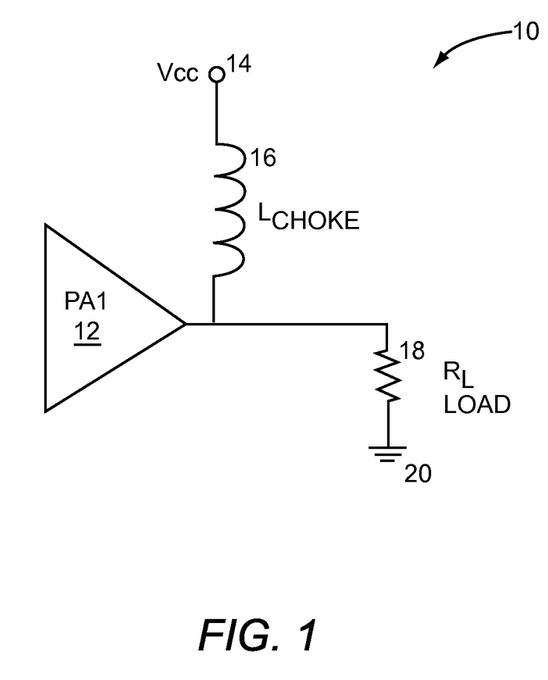
FIG. 1 illustrates a conventional power amplifier (PA) configuration.

FIG. 1 illustrates a conventional power amplifier (PA) configuration. The maximum output power is determined by the collector (or drain) voltage and the load. Specifically, maximum output power for an ideal amplifier is calculated by the following equation. Equation (1): $Poutmax = Vcc^2/(2 \times R_L)$. Poutmax is the maximum output power, Vcc is the power supply voltage, and $R_L$ is the load resistance.

Figure 2:
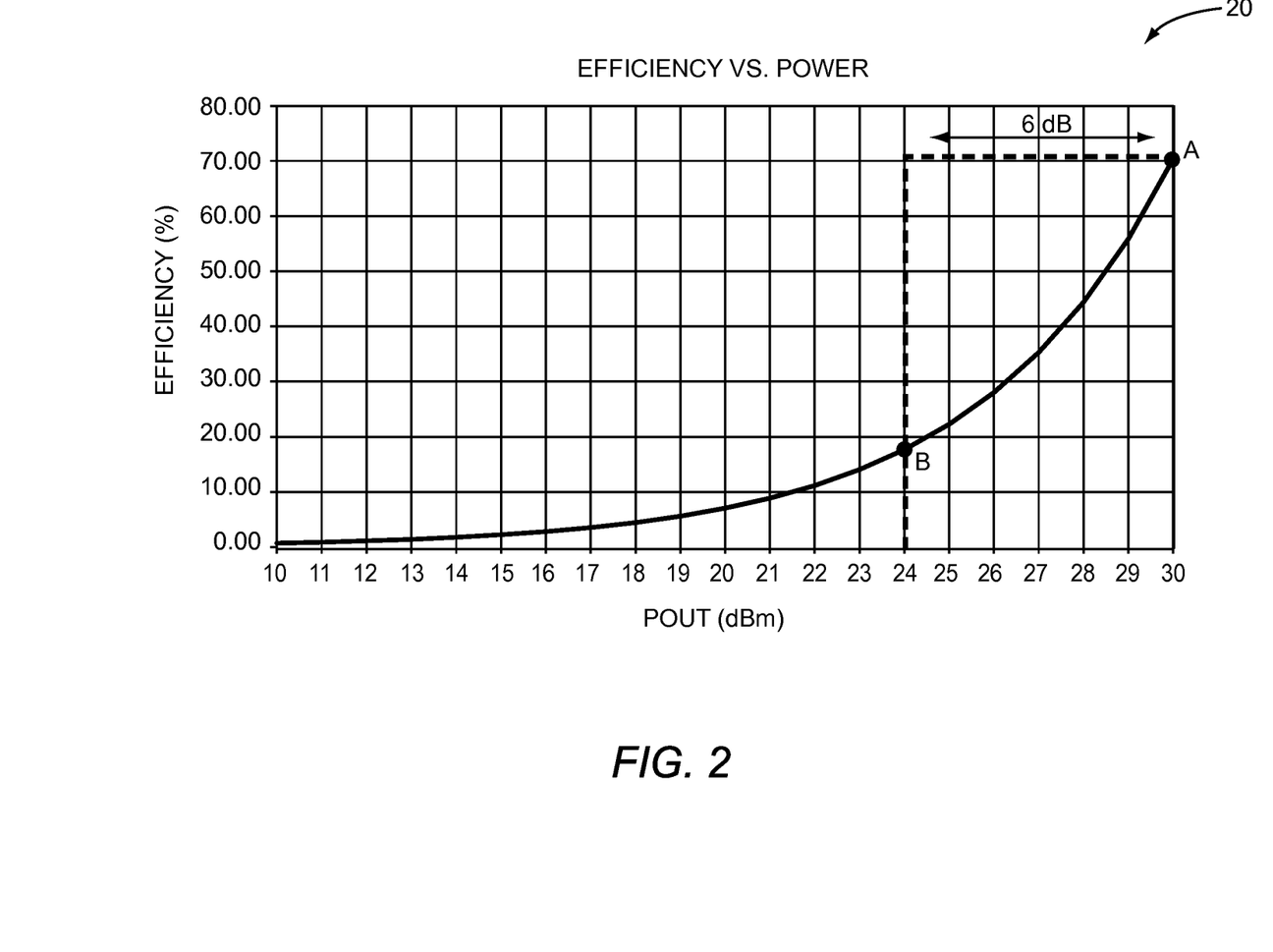
FIG. 2 illustrates a maximum efficiency and a reduced efficiency for a conventional power amplifier configuration.

FIG. 2 illustrates that a maximum efficiency of 70% for an exemplary conventional power amplifier will occur at maximum output power of about 30 dBm. As output power is reduced ("backed off" while holding both Vcc and Rload constant) to 24 dbm, the efficiency is reduced to about 18%. This greatly reduced efficiency is a costly problem.

Conventional methods (to maintain efficiency as output power is reduced) include decreasing the maximum output power by decreasing Vcc and/or by increasing $R_L$. These conventional methods have many drawbacks. For example, controlling and decreasing Vcc is difficult and expensive, and does not reduce the active area of the power amplifier.

Another conventional method is provided by the publication "Fully Integrated CMOS Power Amplifier with Efficiency Enhancement at Power Back-Off," by Gang Liu et. al., IEEE Journal of Solid State Circuits, Vol. 43, No. 3, March 2008. In this conventional solution, one of the differential pairs of a series combined transformer is shut off. Unfortunately, the additional circuitry and switching elements required inherently add loss to the circuit, reduce efficiency, and increase expense. Further, the primary capacitance and the secondary capacitance of the series combined transformer will have to be modified.

Many other conventional methods have been proposed, but none work well.

The goals are to operate efficiently in a reduced power mode while maintaining linearity over the same bandwidth as a nominal "high power" mode.

SUMMARY

In a first embodiment, a combined transformer includes: a first differential amplifier, a first primary inductor, a second differential amplifier, a second primary inductor, and a switch. The switch is an inventive element.

The first differential amplifier pair includes a first positive amplifier and a first negative amplifier, and is configured such that the output of the first positive amplifier is about 180 degrees out of phase with the output of the first negative amplifier.

The first primary inductor links the output of the first positive amplifier to the output of the first negative amplifier.

The second differential pair includes a second positive amplifier and a second negative amplifier, and is configured such that the output of the second positive amplifier is about 180 degrees out of phase with the output of the second negative amplifier.

The second primary inductor links the output of the second positive amplifier to the output of the second negative amplifier.

The switch links the first primary inductor to the second primary inductor.

In a second embodiment, a first primary capacitor and a second primary capacitor are added to the first embodiment. The first primary capacitor links the output of the first positive amplifier to the output of the first negative amplifier, and is in parallel with the first primary inductor. The second primary capacitor links the output of the second positive amplifier to the output of the second negative amplifier, and is in parallel with the second primary inductor.

For a single-mode or multi-mode amplifier, a dual switched primary transformer provides enhanced efficiency at backed off power through a combination of impedance switching and power combining. The impedance switching and power combining is accomplished by reconfiguring the dual primary inductors (transformers) into a single primary inductor.

In some embodiments, a switch is placed in the transformer at a location where a virtual ground will be created when the switch is closed (thus joining two primary side inductors into a single primary side inductor). This virtual ground eliminates loading effects typically seen in conventional power combining transformer architectures.

This novel impedance switching and power combining provides a novel broadband path to amplifier efficiency enhancement versus power by addressing both load line and active area. This novel approach also eliminates additional element switching and additional switches typically required to address parasitic loading. As a result, size, cost, and complexity are reduced while bandwidth and performance are enhanced.

Some embodiments also provide a solution to load switching that overcomes the loading effects of traditional series combined transformers (SCT) and parallel combined transformers (PCT). These loading effects tend to be the limiting factors in transformer efficiency and bandwidth as well as the source of increased complexity.

Some embodiments were developed to enhance backed off efficiency of power amplifiers, as well as to provide load switching in multi-mode amplifiers, and are applicable for any application requiring differential impedance switching.

One important feature of some embodiments is the ability to reconfigure tuned transformers while maintaining tune over the band of interest. This feature is applicable to any transformer reconfiguration of the impedance. Further, this feature is useful for un-tuned and single tuned transformers, as well as double tuned for impedance reconfiguration.

In some embodiments, closing the switch changes the impedance of the transformers, which reduces the maximum power by about 3 dBm. Further, shutting down two of the amplifiers (in one embodiment, the two "inside" amplifiers in a pair of differential amplifiers) further reduces the maximum power by about another 3 dBm.

Those skilled in the art will appreciate the scope of the present disclosure and realize additional aspects thereof after reading the following detailed description of the preferred embodiments in association with the accompanying drawing figures.

BRIEF DESCRIPTION OF THE FIGURES

The accompanying figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

FIG. 1 illustrates a conventional power amplifier (PA) configuration 10. PA1 is a conventional power amplifier 12. Vcc is a collector or gate voltage at node 14. $L_{CHOKE}$ is the inductance of inductor 16, which connects Vcc with the output of the conventional power amplifier. $R_L$ is the resistance of load 18. The maximum output power Poutmax for an ideal amplifier is calculated as follows:

$$\text{Poutmax} = Vcc^2/(2 \times R_L). \quad \text{Equation (1)}$$

FIG. 2 illustrates a maximum efficiency and a reduced efficiency for a conventional power amplifier configuration. Graph 20 illustrates Efficiency (%) in the vertical axis and output power Pout (dBm) in the horizontal axis. Point A indicates that a maximum efficiency of 70% for a conventional power amplifier will occur at maximum output power of about 30 dBm. As output power is reduced ("backed off" while holding both Vcc and $R_L$ constant), Point B indicates that efficiency is greatly reduced to just 18% at a reduced power of 24 dbm. This greatly reduced efficiency is a costly problem.

Figure 3:
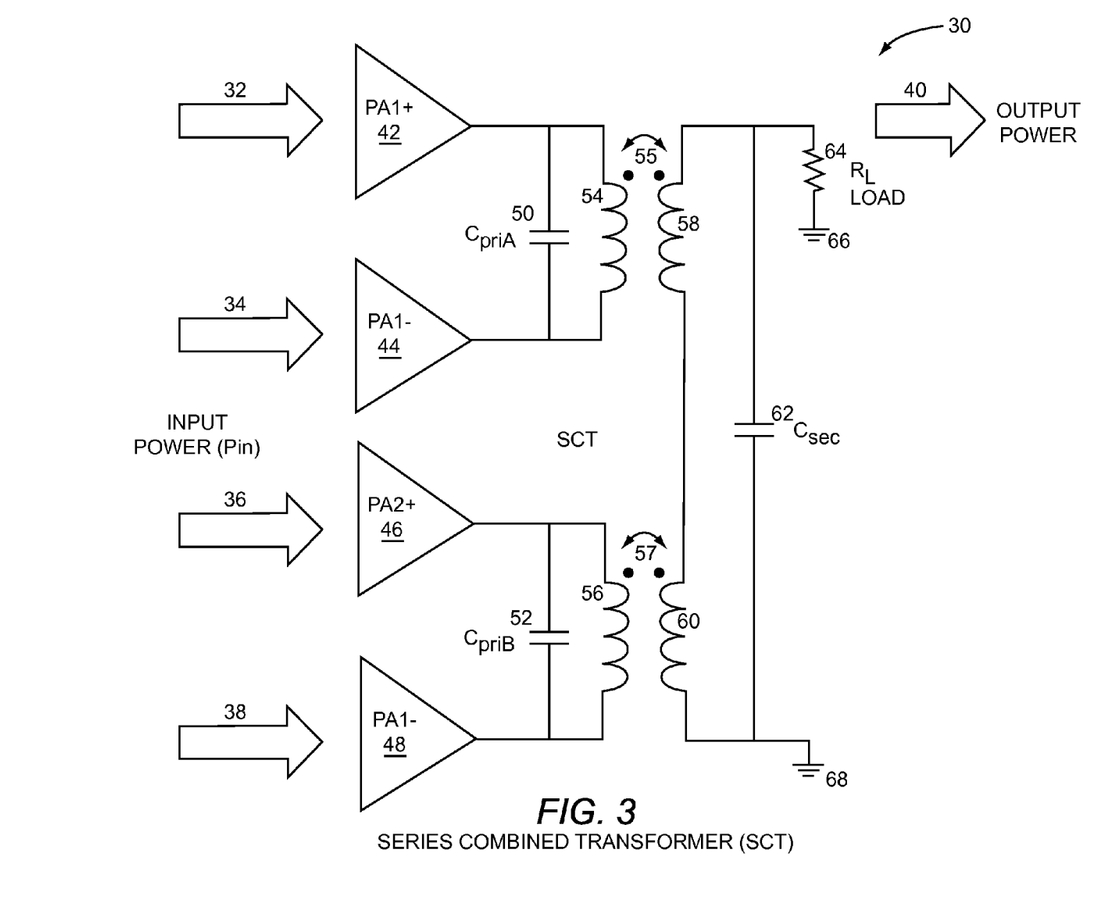
FIG. 3 illustrates a conventional series combined transformer (SCT).

FIG. 3 illustrates a conventional series combined transformer (SCT) 30 comprising two differential pairs of power amplifiers. Input powers 32, 34, 36, and 38 add up to output power 40. Power amplifiers 42 (PA1+) and 44 (PA1−) form a first differential amplifier pair, which is named PA1+/PA1− for convenience. In a differential amplifier pair, the two amplifiers are being driven 180 degrees out of phase with respect to each other.

The amplifiers of the first differential amplifier pair may be described as a "first positive amplifier" 42 (PA1+) and as a "first negative amplifier" 44 (PA1−) to emphasize their 180 degrees out of phase relationship with each other.

In the first differential pair (PA1+/PA1−), first primary capacitor $C_{priA}$ 50 and first primary inductor 54 each link the outputs of the first differential pair (connect the output of the of the first positive amplifier to the output of the first negative amplifier). First primary inductor 54 is magnetically coupled to first secondary inductor 58, and the two dots 55 indicate that the top of the first primary inductor 54 is in phase with the top of the first secondary inductor 58.

Power amplifiers 46 and 48 form a second differential amplifier pair (PA2+/PA2−), and are driven such that the outputs of the second differential pair (PA2+/PA2−) are 180 degrees out of phase with respect to the outputs of the first differential pair (PA1+/PA1−).

The amplifiers of the second differential amplifier pair may be described as a "second positive amplifier" 46 (PA2+) and as a "second negative amplifier" 48 (PA2−) to emphasize their 180 degrees out of phase relationship with each other.

In the second differential pair (PA2+/PA2−), second primary capacitor $C_{priB}$ 52 and second primary inductor 56 both link the outputs of the second differential pair. Second primary inductor 56 is magnetically coupled to second secondary inductor 60, and the two dots 57 indicate that the top of the second primary inductor 56 is in phase with the top of the second secondary inductor 60.

In this specification and claims, the "top" of a secondary inductor is defined as being in phase with the "top" of an associated (magnetically coupled) primary inductor. In other words, "top" indicates a dot at that end of an inductor, and "bottom" indicates no dot at that end of the inductor.

The first secondary inductor 58 and the second secondary inductor 60 are in series, as implied by the name of this circuit: series combined transformer (SCT) 30. Secondary capacitor Csec 62 links the outputs of this series of inductors (the top of first secondary inductor 58 and the bottom of second secondary inductor 60).

A top of first secondary inductor 58 is linked by load $R_L$ 64 to a first ground 66. A bottom of second secondary inductor 60 is grounded to a second ground 68.

One conventional solution to increase efficiency at reduced power is provided by the publication "Fully Integrated CMOS Power Amplifier with Efficiency Enhancement at Power Back-Off," by Gang Liu et. al., IEEE Journal of Solid State Circuits, Vol. 43, No. 3, March 2008. In this conventional solution (the "Liu solution"), one of the differential pairs of a series combined transformer is shut off (disabled). For example, in FIG. 3 the second differential pair (PA2+/PA2−) is shut off. Unfortunately, the additional circuitry and switching elements required inherently add loss to the circuit, reduce efficiency, and increase expense. Further, the primary capacitance and the secondary capacitance will have to be modified.

Figure 4:
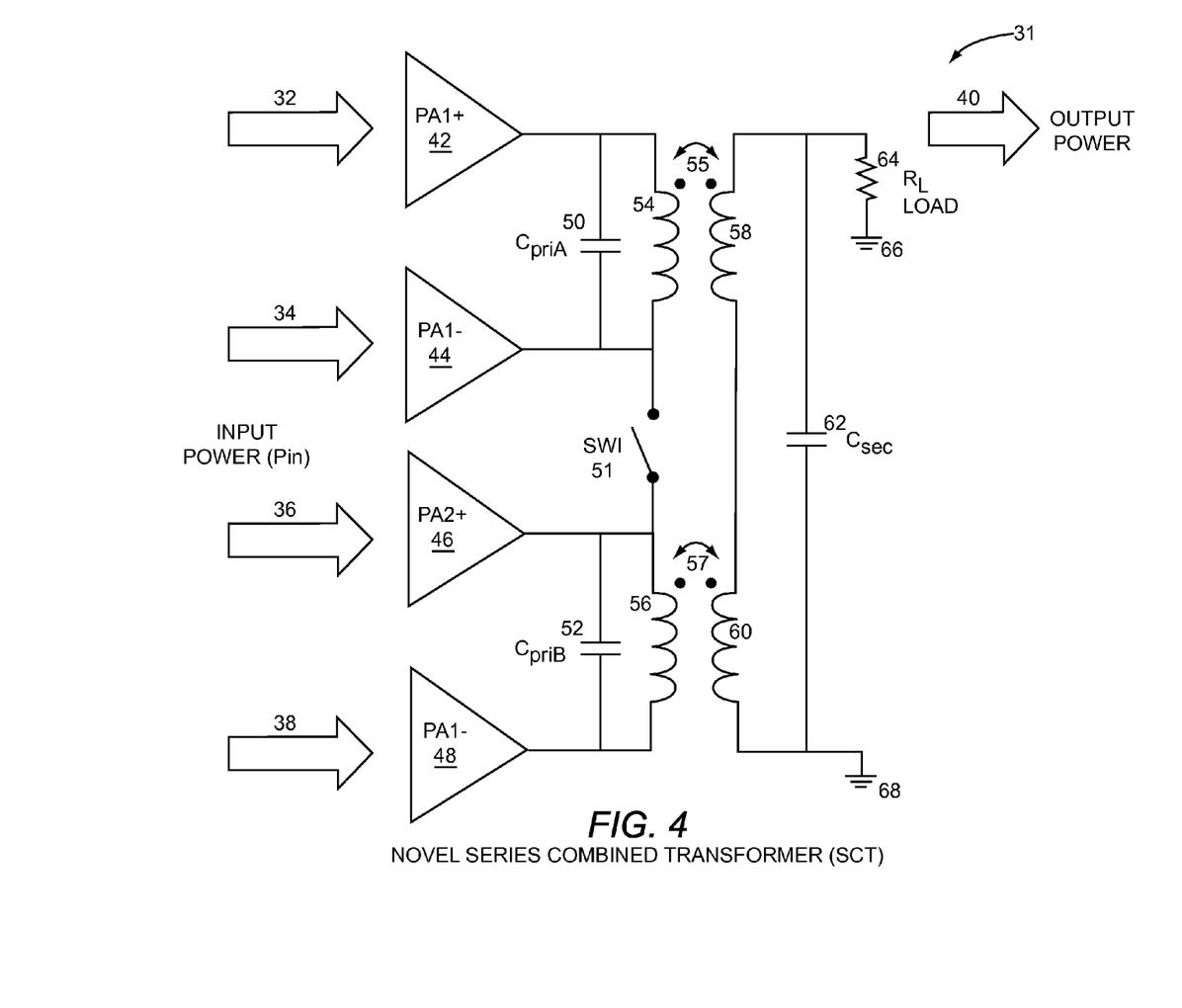
FIG. 4 illustrates a novel series combined transformer (SCT) with an open switch between the two primary inductors.

FIG. 4 illustrates a novel series combined transformer (SCT) 31 with an open switch SW1 51 between the two primary inductors (54 and 56). With the switch SW1 51 in the open position, this SCT circuit functions exactly like the SCT of FIG. 3 (except that the switch SW1 creates novel possibilities).

Figure 5:
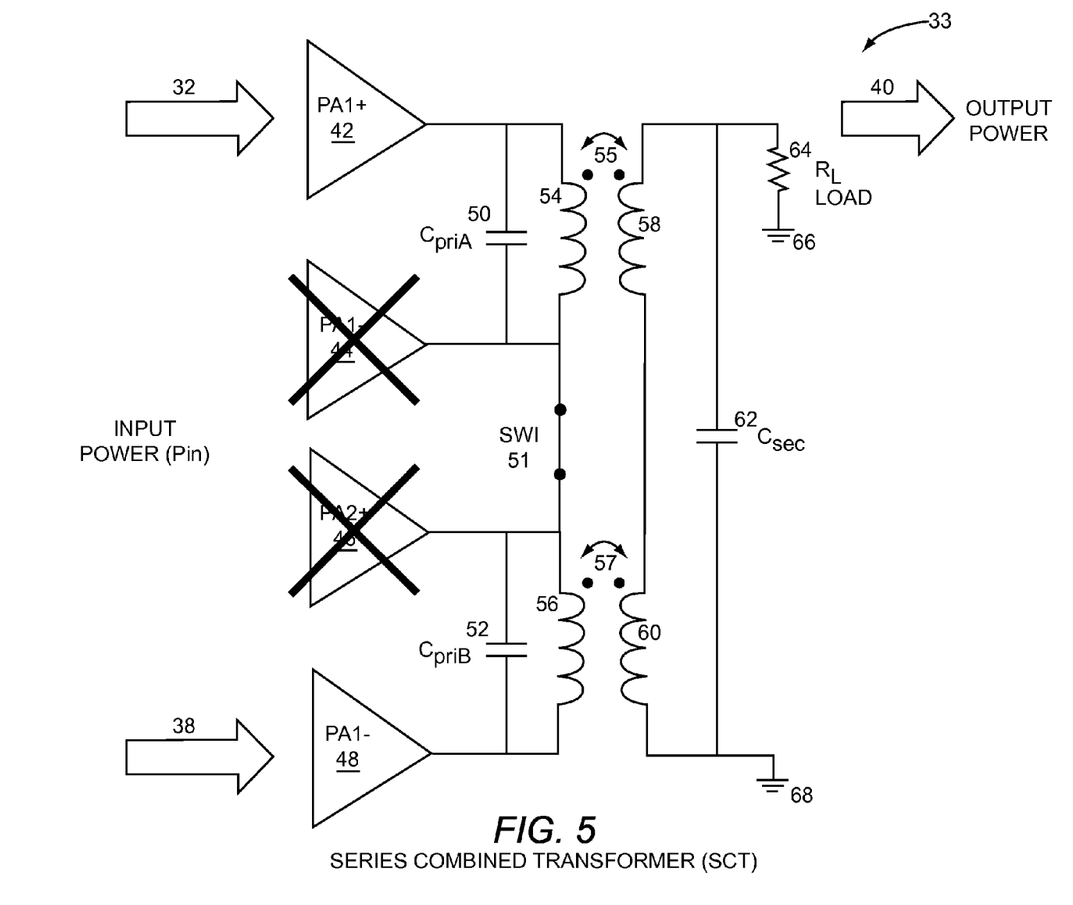
FIG. 5 illustrates a novel series combined transformer (SCT) with a closed switch between the two primary inductors, and with the two "inside" power amplifiers shut off.

FIG. 5 illustrates the novel series combined transformer (SCT) 33 with a closed switch SW1 51 between the two primary inductors (54 and 56), and with the two "inside" power amplifiers (PA1− 44 and PA2+ 46) shut down. Only one power amplifier from each of the differential pairs is shut down.

Figure 6:
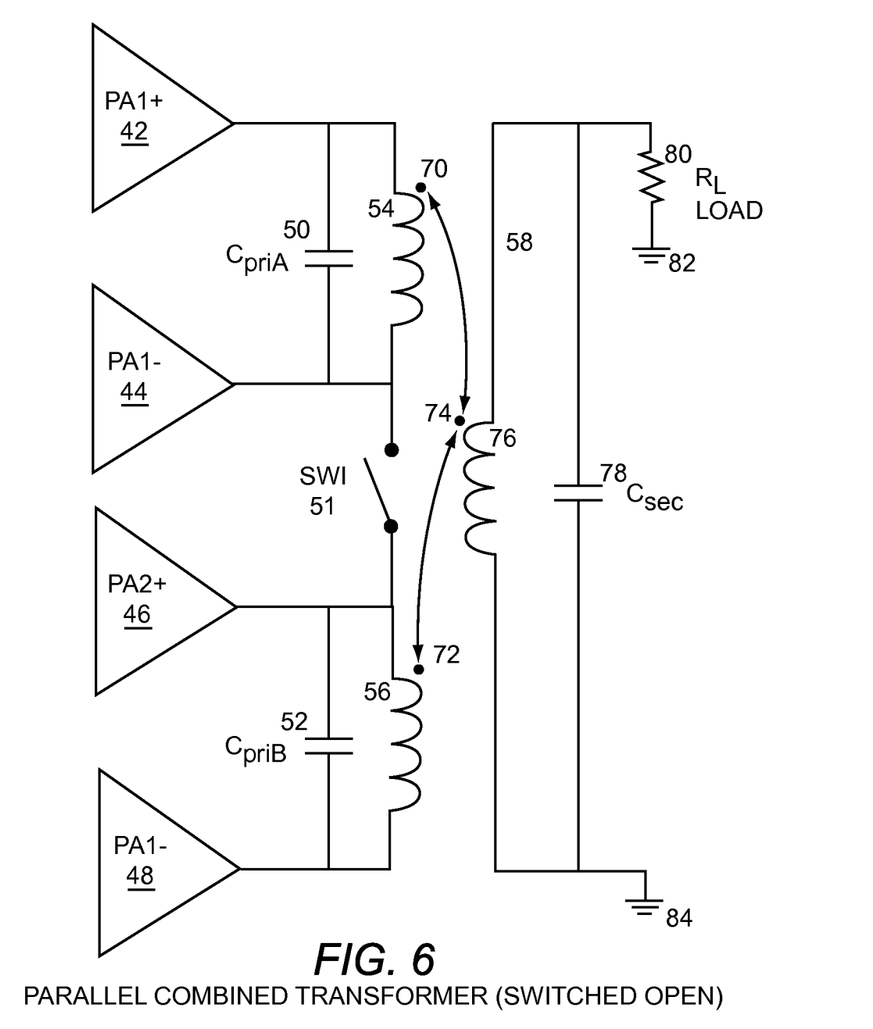
FIG. 6 illustrates a novel parallel combined transformer (PCT) with an open switch between the two primary inductors.

FIG. 6 illustrates a novel parallel combined transformer (PCT) with an open switch between the two primary inductors. The primary side of FIG. 6 (novel PCT) is identical to the primary side of FIG. 4 (novel SCT), and does not need further description here. The switch SW1 51 is in the open position, and therefore this parallel combined transformer will operate like a conventional parallel combined transformer (until the switch is closed). As shown, with switch open, FIG. 6 illustrates a high power mode of the novel parallel combined transformer.

In FIG. 6, secondary inductor 76 is magnetically coupled to first primary inductor 54, as indicated by dots 70 and 74, and the arrow between dots 70 and 74. Additionally, secondary inductor 76 is magnetically coupled to second primary inductor 56, as indicated by dots 72 and 74, and the arrow between dots 72 and 74.

Secondary capacitor 78 is linked in parallel with secondary inductor 76. Load $R_L$ 80 links a top of secondary inductor 76 to a first ground 82. A bottom of secondary inductor 76 is grounded to ground 84.

Figure 7:
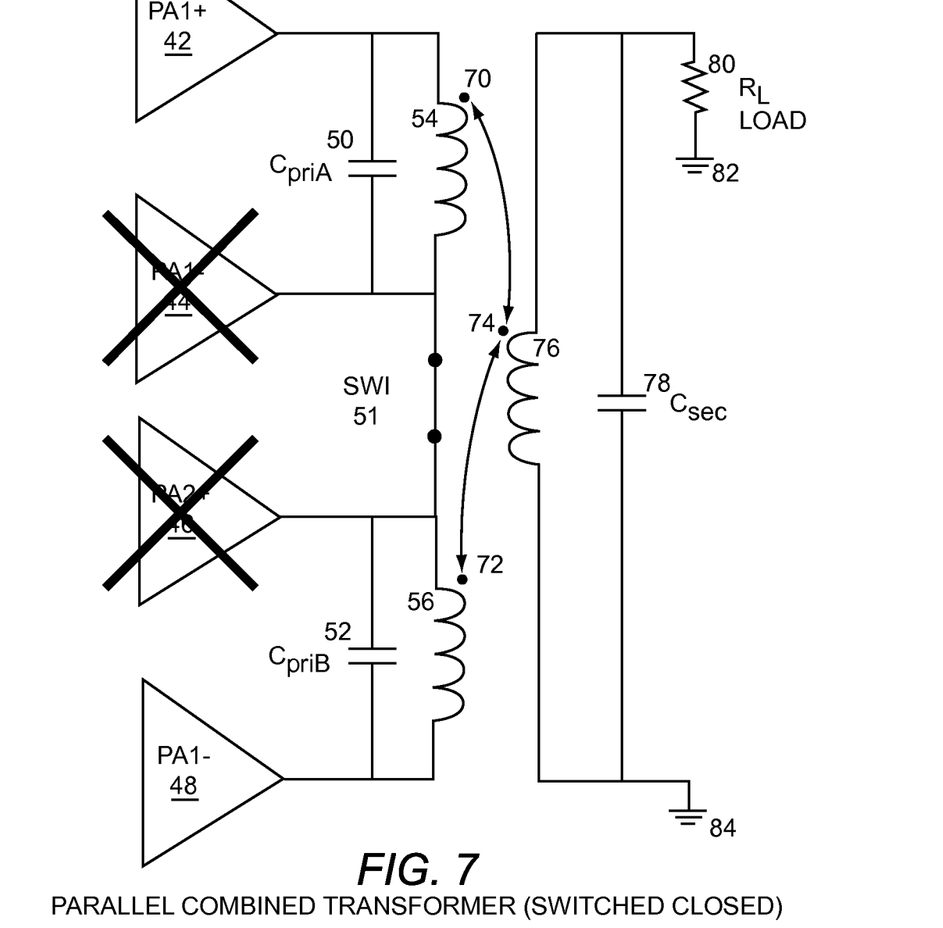
FIG. 7 illustrates the novel parallel combined transformer (PCT) with a closed switch between the two primary inductors, and with the two "inside" power amplifiers shut off.

FIG. 7 illustrates the novel parallel combined transformer (PCT) of FIG. 6, except that the switch is closed and the two "inside" power amplifiers shut off.

In FIG. 7, switch SW1 51 is closed, thus placing the first primary inductor 54 and the second primary inductor 56 into a series. Further, the two "inside" power amplifiers (PA1− 44 and PA2+ 46) are shut down. Only one power amplifier from each of the differential pairs is shut down. This is a low power mode for the novel parallel combined transformer.

Figure 8:
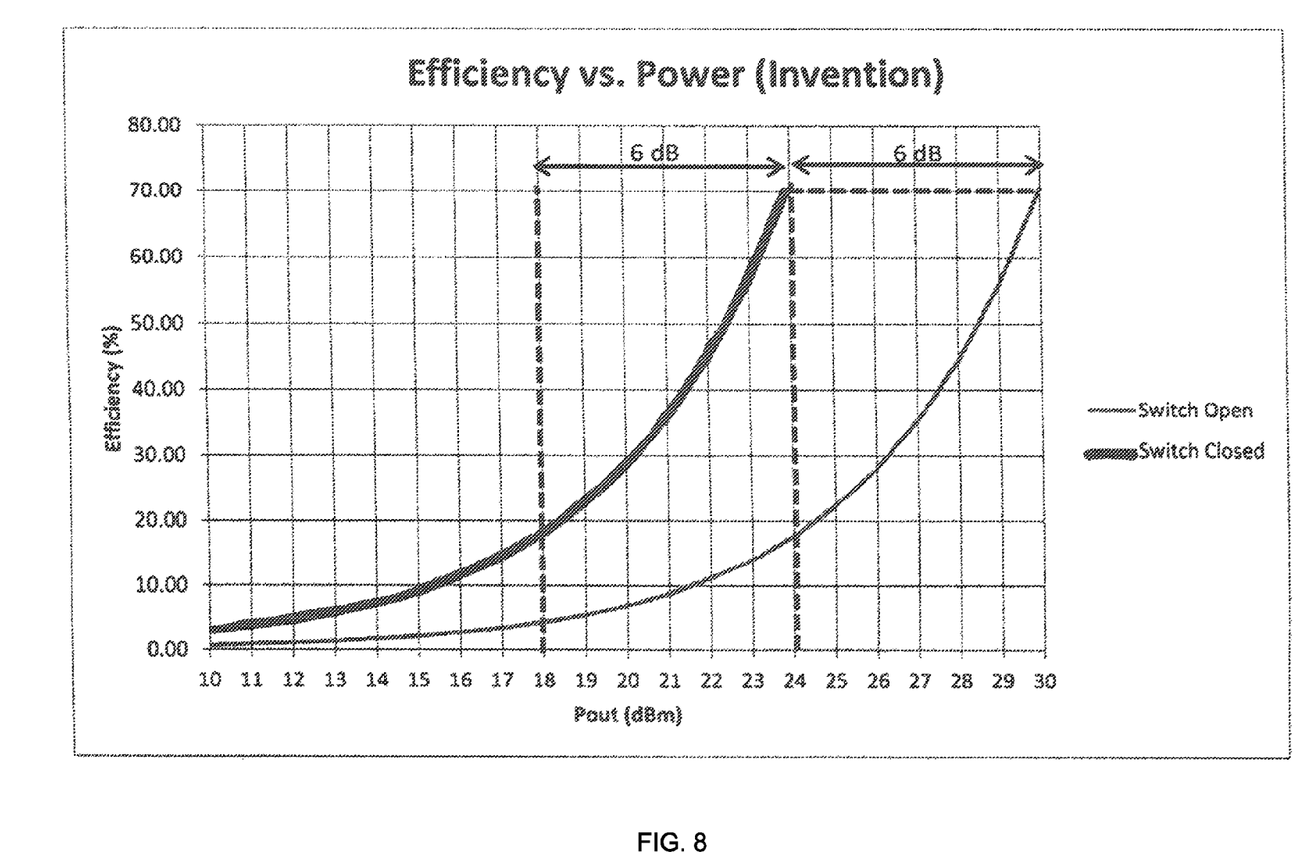
FIG. 8 illustrates a 6 dB shift in the efficiency curve of an illustrative series combined transformer when the novel switch is closed.

FIG. 8 illustrates a 6 dB shift in the efficiency curve of an illustrative series combined transformer when the novel switch is closed.

In FIG. 8, the thin line illustrates a conventional efficiency curve (as previously discussed regarding FIG. 2), which occurs when the novel switch is open.

The thick line illustrates a novel efficiency curve for a preferred embodiment when the switch is closed. The maximum power is decreased by 6 dB, such that a high efficiency of 70% is maintained when the maximum power is reduced from 30 dBm (when the switch is open) down to 24 dBm when the switch is closed. Of this 6 dB decrease, about 3 dB is attributed to the closed switch effectively changing the impedance of the transformer, and about 3 dB is attributed to shutting down two of the amplifiers (the "inside amplifiers") at the same time that the switch is closed.

Those skilled in the art will recognize improvements and modifications to the preferred embodiments of the present disclosure. All such improvements and modifications are considered within the scope of the concepts disclosed herein and the claims that follow.

What is claimed is:

1. A combined transformer comprising:
a first differential amplifier pair comprising a first positive amplifier and a first negative amplifier, and configured such that the output of the first positive amplifier is about 180 degrees out of phase with the output of the first negative amplifier;
a first primary inductor linking the output of the first positive amplifier to the output of the first negative amplifier;
a second differential pair comprising a second positive amplifier and a second negative amplifier, and configured such that the output of the second positive amplifier is about 180 degrees out of phase with the output of the second negative amplifier;
a second primary inductor linking the output of the second positive amplifier to the output of the second negative amplifier; and
a switch linking the first primary inductor to the second primary inductor.

2. The combined transformer of claim 1, further comprising:
a first primary capacitor linking the output of the first positive amplifier to the output of the first negative amplifier, wherein the first primary capacitor is in parallel with the first primary inductor; and
a second primary capacitor linking the output of the second positive amplifier to the output of the second negative amplifier, wherein the second primary capacitor is in parallel with the second primary inductor.

3. The combined transformer of claim 2, wherein:
the output of the first positive amplifier is directly connected to a top of the first primary inductor;
the output of the first negative amplifier is directly connected to a bottom of the first primary inductor;
the output of the second positive amplifier is directly connected to a top of the second primary inductor;
the output of the second negative amplifier is directly connected to a bottom of the second primary inductor;
the switch links the bottom end of the first primary inductor to the top of the second primary inductor.

4. The combined transformer of claim 3, wherein the switch is closed.

5. The combined transformer of claim 3, wherein the output of the first positive amplifier is in phase with the output of the second positive amplifier.

6. The combined transformer of claim 3, further comprising:
a first secondary inductor magnetically coupled to the first primary inductor; and
a second secondary inductor magnetically coupled to the second primary inductor.

7. The combined transformer of claim 6, wherein a bottom of the first secondary inductor and a top of the second secondary inductor are connected to form a secondary series inductor.

8. The combined transformer of claim 7, further comprising:
a secondary capacitor in parallel with the secondary series inductor.

9. The combined transformer of claim 8, further comprising:
a load linking a top of the first secondary inductor to a first ground.

10. The combined transformer of claim 9, wherein a bottom of the second secondary inductor is grounded to a second ground.

11. The combined transformer of claim 10, wherein the switch is open.

12. The combined transformer of claim 10, wherein the switch is closed.

13. The combined transformer of claim 12, wherein the first positive amplifier is on, the first negative amplifier is shut down, the second positive amplifier is shut down, and the second negative amplifier is on.

14. The combined transformer of claim 3, further comprising a control portion configured to provide selection between a high power mode and a low power mode.

15. The combined transformer of claim 14, wherein the high power mode opens the switch, turns on the first positive amplifier, turns on the first negative amplifier, turns on the second positive amplifier, and turns on the second negative amplifier.

16. The combined transformer of claim 15, wherein the low power mode closes the switch, turns on the first positive amplifier, shuts down the first negative amplifier, shuts down the second positive amplifier, and turns on the second negative amplifier.

17. The combined transformer of claim 16, further comprising:
   a first secondary inductor magnetically coupled with the first primary inductor; and
   a second secondary inductor magnetically coupled with the second primary inductor, and
   wherein a bottom of the first secondary inductor and a top of the second secondary inductor are connected to form a secondary series inductor.

18. The combined transformer of claim 17, further comprising:
   a secondary capacitor in parallel with the secondary series inductor; and
   a load linking a top of the first primary inductor to a first ground, and
   wherein a bottom of the second secondary inductor is linked to a second ground.

19. The combined transformer of claim 3, further comprising:
   a secondary inductor magnetically coupled to the first primary inductor, and magnetically coupled to the second primary inductor.

20. The combined transformer of claim 19, further comprising:
   a secondary capacitor in parallel with the secondary inductor.

21. The combined transformer of claim 20, further comprising:
   a load linking a top end of the secondary inductor to a first ground.

22. The combined transformer of claim 21, wherein a bottom end of the secondary inductor is grounded to a second ground.

23. The combined transformer of claim 22, further comprising a control portion configured to provide selection between a high power mode and a low power mode.

24. The combined transformer of claim 23, wherein the high power mode opens the switch, turns on the first positive amplifier, turns on the first negative amplifier, turns on the second positive amplifier, and turns on the second negative amplifier.

25. The combined transformer of claim 24, wherein the low power mode closes the switch, turns on the first positive amplifier, shuts down the first negative amplifier, shuts down the second positive amplifier, and turns on the second negative amplifier.

* * * * *